(12) United States Patent
Kyranas et al.

(10) Patent No.: US 8,543,073 B2
(45) Date of Patent: *Sep. 24, 2013

(54) METHOD AND SYSTEM FOR LOOP THROUGH FOR MULTI-BAND TV TUNERS AND SET-TOP BOX AND/OR TV SET APPLICATIONS

(75) Inventors: Aristeidis Kyranas, Zografou (GR); Hamed Peyravi, Athens (GR); Konstantinos Vavelidis, Ilioupolis (GR); Nikolaos Kanakaris, Athens (GR)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/619,490

(22) Filed: Sep. 14, 2012

(65) Prior Publication Data
US 2013/0010899 A1    Jan. 10, 2013

Related U.S. Application Data

(63) Continuation of application No. 12/620,020, filed on Nov. 17, 2009, now Pat. No. 8,320,857.

(60) Provisional application No. 61/169,505, filed on Apr. 15, 2009.

(51) Int. Cl.
*H04B 17/02* (2006.01)
*H04B 1/18* (2006.01)

(52) U.S. Cl.
USPC ...... 455/130; 455/137; 455/180.1; 455/188.1

(58) Field of Classification Search
USPC .......... 455/3.02, 132, 140, 179.1–180.2, 455/188.1–191.3, 137; 348/725, 729, 731
See application file for complete search history.

(56) References Cited

U.S. PATENT DOCUMENTS

| | | | |
|---|---|---|---|
| 3,823,379 A | | 7/1974 | George |
| 4,002,986 A | | 1/1977 | Ma |
| 4,118,679 A | | 10/1978 | Hiday et al. |
| 4,408,348 A | | 10/1983 | Theriault |
| 4,624,014 A | | 11/1986 | Chen |
| 5,016,660 A | * | 5/1991 | Boggs ........................... 132/322 |
| 5,276,909 A | | 1/1994 | Milner et al. |
| 5,930,696 A | * | 7/1999 | Tzuang et al. ............... 455/311 |
| 5,937,337 A | * | 8/1999 | Marrah et al. ............... 455/142 |
| 5,959,592 A | * | 9/1999 | Petruzzelli .................... 725/68 |
| 6,151,488 A | | 11/2000 | Brekelmans |

(Continued)

*Primary Examiner* — Simon Nguyen
(74) *Attorney, Agent, or Firm* — Sterne, Kessler, Goldstein & Fox P.L.L.C.

(57) ABSTRACT

Methods and systems for loop-through for multi-band TV tuners and set-top box and/or TV set applications are disclosed and may include generating master and slave output signals from one or more low-noise amplifiers including master and slave stages. The master and slave stages may include parallel-coupled gain paths. Gate terminals and source terminals of input transistors for the master and slave stages may be directly coupled. The input transistors for the master and slave stages may share an inductor coupled to the source terminals and to ground. The master and slave stages may include cascode stages. VHF and UHF signals may be amplified in the multi-band receiver. The generated master output signal may be processed in the multi-band receiver, and may be utilized to generate I and Q output signals. A plurality of the slave output signals may be summed and communicated to a receiver external to the multi-band receiver.

20 Claims, 11 Drawing Sheets

(56) References Cited

U.S. PATENT DOCUMENTS

| | | |
|---|---|---|
| 6,236,437 B1 * | 5/2001 | Suzuki et al. ............ 348/731 |
| 6,965,757 B2 | 11/2005 | Eray |
| 7,034,632 B2 | 4/2006 | Gomez et al. |
| 7,251,466 B2 * | 7/2007 | Porret et al. ............ 455/190.1 |
| 7,280,163 B2 | 10/2007 | Suzuki et al. |
| 7,340,230 B2 | 3/2008 | Khoini-Poorfard et al. |
| 7,356,314 B2 * | 4/2008 | Forrester et al. ............ 455/103 |
| 7,369,827 B1 * | 5/2008 | Koch et al. ............ 455/191.1 |
| 7,505,087 B2 * | 3/2009 | Kang ............ 348/731 |
| 7,558,545 B2 | 7/2009 | Maejima |
| 2003/0179723 A1 * | 9/2003 | Novak et al. ............ 370/316 |
| 2004/0214545 A1 * | 10/2004 | Kushima et al. ............ 455/232.1 |
| 2006/0040628 A1 | 2/2006 | Porret et al. |
| 2006/0073800 A1 * | 4/2006 | Johnson et al. ............ 455/182.3 |
| 2009/0141183 A1 * | 6/2009 | Ecoff et al. ............ 348/731 |

\* cited by examiner

_US 8,543,073 B2_

METHOD AND SYSTEM FOR LOOP THROUGH FOR MULTI-BAND TV TUNERS AND SET-TOP BOX AND/OR TV SET APPLICATIONS

CROSS-REFERENCE TO RELATED APPLICATIONS

This application is a continuation of U.S. patent application Ser. No. 12/620,020, filed on Nov. 17, 2009, now allowed, which claims benefit to U.S. Provisional Application No. 61/169,505, filed on Apr. 15, 2009, all of which are hereby incorporated herein by reference in their entireties.

BACKGROUND OF THE INVENTION

1. Field of the Invention

Certain embodiments of the invention relate to multimedia communication. More specifically, certain embodiments of the invention relate to a method and system for loop through circuitry for multi-band TV tuners and set-top box and/or TV set applications.

2. Background Art

Communication systems provide several options for obtaining access to broadcast video content. Consumers may receive broadcast standard definition (SD) and high definition (HD) television broadcasts from the air with an antenna. Analog and digital cable television networks distribute a variety of television stations in most communities on a subscription basis. In addition, satellite television and new internet protocol (IP) television services provide other subscription alternatives for consumers. Analog video signals may be coded in accordance with a number of video standards including NTSC, PAL and SECAM. Digital video signals may be encoded in accordance with standards such as Quicktime, (motion picture expert group) MPEG-2, MPEG-4, or H.264. In addition to digital coding, some video signals are scrambled to provide access to these signals, only to the subscribers that have paid to access the particular content.

The desire for video content has driven cellular telephone networks to begin offering video programs to their subscribers as streaming video. In this fashion, users of mobile devices may have access to video programming on the go. Some of the techniques used in providing broadcast video content to stationary devices are not suitable for adaptation to the viewing environment associated with a handheld mobile device.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for loop through circuitry for multi-band TV tuners and set-top box and/or TV set applications, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

BRIEF DESCRIPTION OF THE DRAWINGS/FIGURES

DETAILED DESCRIPTION OF THE INVENTION

Certain aspects of the invention may be found in a method and system for loop through circuitry for multi-band TV tuners and set-top box and/or TV set applications. Exemplary aspects of the invention may comprise generating master and slave output signals in a multi-band receiver from one or more low-noise amplifiers comprising master and slave stages. The master and slave stages may comprise parallel-coupled gain paths. Gate terminals and source terminals of input transistors for the master and slave stages may be directly coupled. The input transistors for the master and slave stages may share an inductor coupled to the source terminals and to ground. The master and slave stages may comprise cascode stages. VHF and UHF signals may be amplified in the multi-band receiver. The generated master output signal may be processed in the multi-band receiver, and may be utilized to generate I and Q output signals. A plurality of the slave output signals may be summed and communicated to a receiver external to the multi-band receiver.

Figure 1:
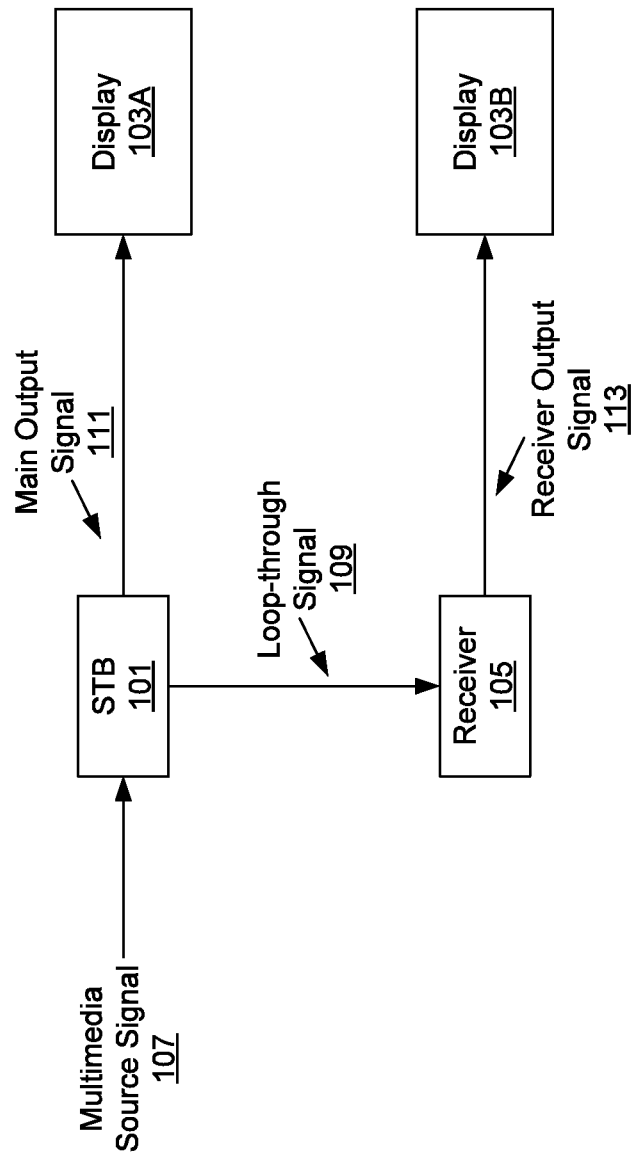
FIG. 1 is a block diagram of an exemplary video network, in which loop through signals for multi-band TV tuners and set-top box and/or TV applications may be provided, in accordance with an embodiment of the invention.

FIG. 1 is a block diagram of an exemplary video network, in which loop through signals for multi-band TV tuners and set-top box and/or TV applications may be provided, in accordance with an embodiment of the invention. Referring to FIG. 1, there is shown a set-top box 101, displays 103A and 103B, and a receiver 105. There is also shown a multimedia source signal 107, a loop-through signal 109, a main output signal 111, and a receiver output signal 113.

The set-top box (STB) 101 may comprise suitable circuitry, logic, interfaces, and/or code that may be operable to receive multimedia input signals and generate an output signal that may be displayed on the display 103A. Additionally, the STB 101 may be operable to communicate a loop-through signal to another receiver, such as the receiver 105. A loop-through signal may comprise an amplified copy of the original received signal generated from the original signal and communicated to another receiver, for example. The loop-through signal may be generated by two independent low-noise amplifiers (LNAs) or by a master/slave LNA configuration. The STB 101 may receive the multimedia source signal 107 as an input from an antenna, for example, and generate processed outputs for the display 103A and the receiver 105. In another embodiment of the invention, the multimedia source signal 107 may be received from a cable TV or satellite provider. For example, the multimedia source signal 107 may be received from a cable TV headend or a satellite headend.

The STB 101 may also comprise descrambling capability in instances where the received multimedia source signal 107 is scrambled. The STB 101 may comprise a matched transistor master/slave low noise amplifier that is operable to amplify the received signal and generate two output signals that may be utilized to generate the main output signal 111 and the loop-through signal 109.

The displays 103A and 103B may comprise suitable circuitry, logic, interfaces, and/or code that may be operable to display received video signals. The displays 103A and 103B may comprise standard-definition (SD) or high-definition (HD) televisions (TVs) or monitors, for example and may receive as inputs the main output signal 111 and the receiver output signal 113, respectively.

The receiver 105 may comprise suitable circuitry, logic, interfaces, and/or code that may be operable to receive an input multimedia signal and output a signal for a display, such as the display 103B. The receiver 105 may comprise similar functionality to the STB 101, or may comprise lesser function as a single output system. The receiver 105 may receive as an input, the loop-through signal 109 and the output of the receiver 105 may be communicated to the display 103B.

In operation, the multimedia source signal 107 may be received by the STB 101. The STB 101 may be operable to amplify the received signal utilizing a matched-transistor master/slave low noise amplifier, generating two separate output signals. The amplified signals may be utilized to generate the main output signal 111 and the loop-through signal 109. The loop-through signal 109 may comprise an amplified version of the multimedia source signal 107, such that the receiver 105 may then be operable to tune to separate multimedia programming from the STB 101. The STB 101 and the receiver 105 may tune desired programming to be displayed by the displays 103A and 103B, respectively.

Figure 2:
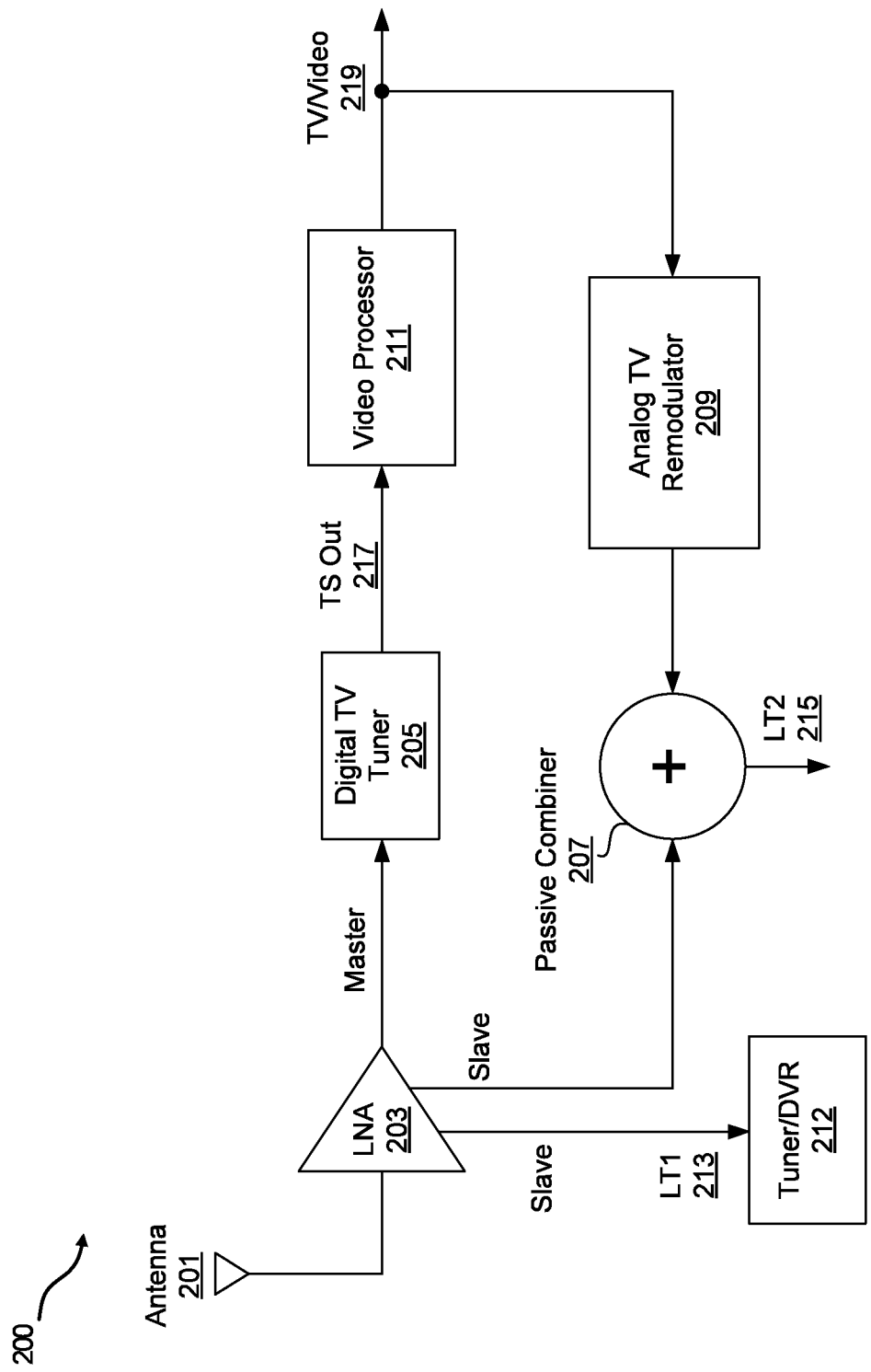
FIG. 2 is a block diagram illustrating exemplary generation of a loop-signal, in accordance with another embodiment of the invention.

FIG. 2 is a block diagram illustrating exemplary generation of a loop-through signal, in accordance with another embodiment of the invention. Referring to FIG. 2, there is shown a loop-through configuration 200 comprising an antenna 201, a low-noise amplifier (LNA) 203, a digital TV tuner 205, a passive combiner 207, an analog TV remodulator 209, a video processor 211, and a tuner/digital video recorder (DVR) 212. There is also shown a loop-through 1 (LT1) signal 213, a LT2 signal, a transport stream (TS) out signal 217, and a TV/video signal 219.

The antenna 201 may comprise suitable circuitry, logic, interfaces, and/or code that may be operable to receive one or more wireless signals for amplification by the LNA 203. The antenna 201 may comprise an antenna that may be externally coupled to the STB 101, for example.

The LNA 203 may comprise suitable circuitry, logic, interfaces, and/or code that may be operable to amplify the signal received by the antenna 201 and generate two or more output signals as an active splitter. One output of the LNA 203 may be coupled to the digital tuner 205 and may comprise a master signal. The LNA 203 may also comprise slave signal outputs that may be coupled to a video recorder or picture-in-picture, LT1 213, or to the passive combiner 207.

The digital tuner 205 may comprise suitable circuitry, logic, interfaces, and/or code that may be operable to tune to desired channel frequencies in the signal received from the antenna 201. The digital tuner 205 may receive as an input, the master signal generated by the LNA 203, and may generate the TS out 217 signal which may be communicated to the video processor 211.

The passive combiner 207 may comprise suitable circuitry, logic, interfaces, and/or code that may be operable to combine two or more signals and generate a combined signal, LT2 215. The outputs of the LNA 203 and the analog TV demodulator 209 may be coupled to the inputs of the passive combiner 207.

The analog TV remodulator 209 may comprise suitable circuitry, logic, interfaces, and/or code that may be operable to remodulate the received TV/video signal 219. The output of the analog TV/video remodulator 209 may be coupled to the passive combiner 207, and may generate a signal that may be displayed by a legacy analog TV, for example.

The video processor 211 may comprise suitable circuitry, logic, interfaces, and/or code that may be operable to process a video signal generated by the digital TV tuner 205 and generate the TV/video out signal 219. The video processor 211 may be operable to generate analog and/or digital signals to be communicated to a display device, and may be utilized to format the signal depending on the type of display, for example.

In operation, a signal received by the antenna 201 may be communicated to the LNA 203 for amplification. The LNA 203 may generate two or more amplified output signals to be communicated to the digital TV tuner 205, the passive combiner 207 and as the output signal LT1 213. The LNA 203 may generate the plurality of output signals without loading effects and reduced noise factor in the slave outputs due to the matched transistor configuration.

The digital TV tuner 205 may receive the amplified master signal and tune to a desired frequency channel, generating the TS out 217 signal to be processed by the video processor 211. The video processor 211 may format the received TS out 217 signal, generating a composite video signal for communication to a display. The TV/video output signal 219 may also be communicated to the analog TV remodulator 209 to generate a PAL/NTSC/SECAM analog modulated signal which may be combined with an output of the LNA 203 before being communicated to a legacy analog TV as the signal LT2 215.

The slave signal, LT1 213, may be communicated to a video recorder or a picture-in-picture tuner, such as the tuner/DVR 212, for example.

Figure 3:
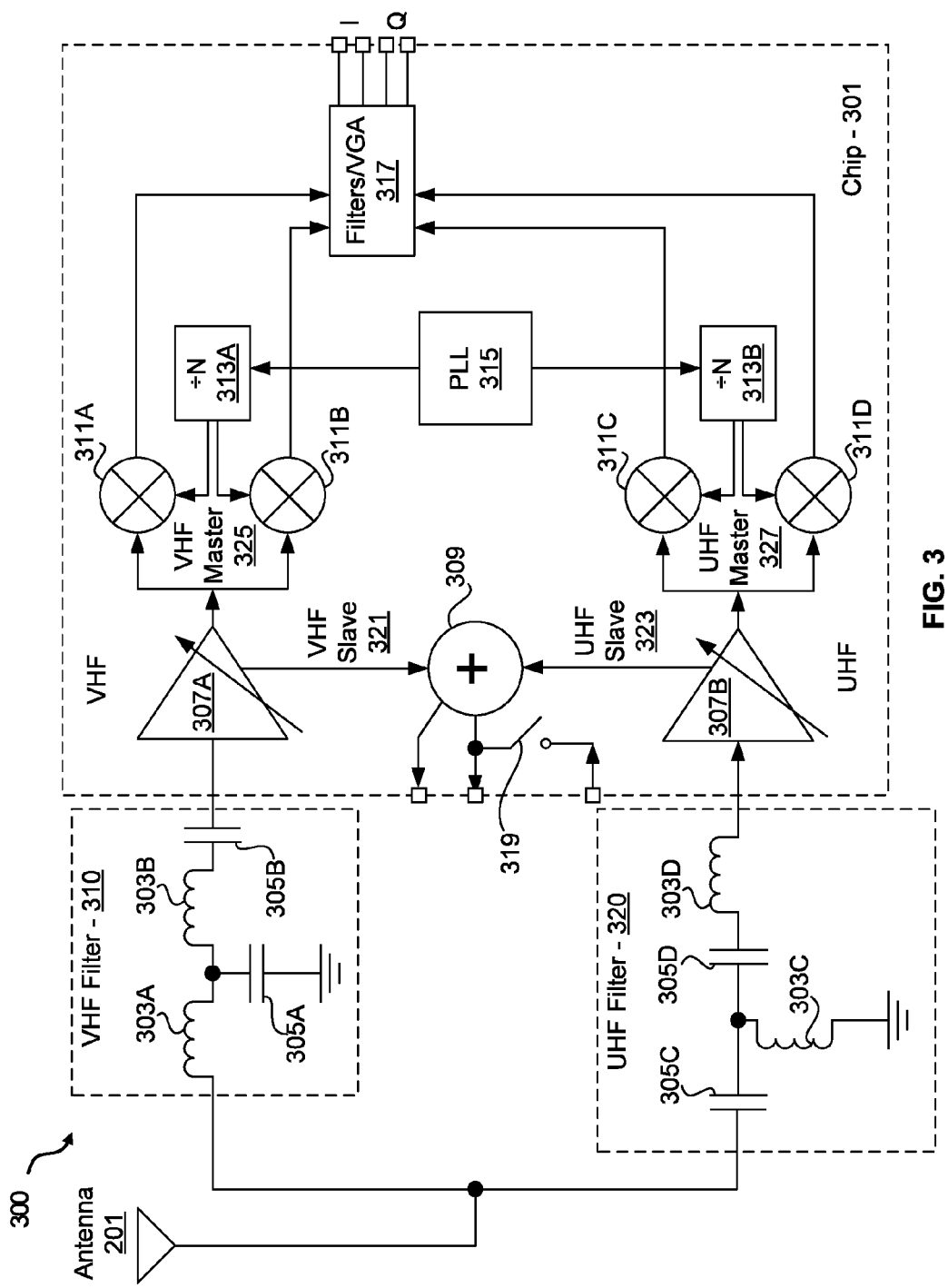
FIG. 3 is a block diagram of an exemplary multi-band front-end, in accordance with an embodiment of the invention.

FIG. 3 is a block diagram of an exemplary multi-band front-end, in accordance with an embodiment of the invention. Referring to FIG. 3, there is shown a multi-band front-end 300 comprising the antenna 201, a VHF filter 310, a UHF filter 320, and a chip 301. The VHF filter 310 may comprise inductors 303A and 303B and capacitors 305A and 305B. The UHF filter 320 may comprise inductors 303C and 303D and capacitors 305C and 305D. There is also shown a VHF slave signal 321, a UHF slave signal 323, a VHF master signal 325, a UHF master signal 327, and I and Q outputs of the chip 301.

The chip 301 may comprise UHF and VHF front-ends comprising LNAs 307A and 307B, a combiner 309, mixers 311A-311D, frequency dividers 313A and 313B, a phase-locked loop (PLL) 315, a filters/variable gain amplifier (VGA) module 317, and a switch 319.

The LNAs 307A and 307B may be substantially similar to the LNA 203 described with respect to FIG. 2, and may comprise variable gain. The LNAs 307A and 307B may be operable to generate master output signals that may be communicated to the mixers 311A-311D as well as the VHF slave signal 321 and the UHF slave signal 323, respectively.

The combiner 309 may comprise suitable circuitry, logic, interfaces, and/or code that may be operable to add received input signals and generate one or more outputs that equal the sum of the inputs. The combiner 309 may receive as inputs, the VHF slave signal 321 and the UHF slave signal 323. In addition, in instances where the switch 319 is closed, a third signal may be communicated to the combiner 309, such as from an external modulator, for example.

The mixers 311A-311B may comprise suitable circuitry, logic, interfaces, and/or code that may be operable to down-convert received VHF/UHF signals to IF or baseband signals utilizing a LO signal generated by the frequency dividers 313A and 313B. The outputs of the mixers 311A-311D may be coupled to the filters/VGA module 317.

The frequency dividers 313A and 313B may comprise suitable circuitry, logic, interfaces, and/or code that may be operable to divide a reference frequency by a number N, thereby generating a LO signal for the mixers 311A-311D. The frequency dividers 313A and 313B may receive as inputs, the clock signal generated by the PLL 315. In an exemplary embodiment, the frequency divider 313A may divide the frequency of the received signal by 6, 8, 12, 16, 24, for example, and the frequency divider 313B may divide the frequency by 2 or 3, for example. These values may allow the generation of appropriate down-conversion LO frequencies for VHF and UHF, respectively, given a PLL frequency of 1.2-1.8 GHz.

The PLL 315 may comprise suitable circuitry, logic, interfaces, and/or code that may be operable to generate a clock signal that may be frequency shifted by the frequency dividers 313A and 313B and subsequently communicated to the mixers 311A-311D. The PLL 315 may generate a 1.2-1.8 GHz clock signal, for example.

The filters/VGA module 317 may comprise suitable circuitry, logic, interfaces, and/or code that may be operable to filter out undesired frequencies resulting from the down-conversion by the mixers 311A-311D, and may also amplify the signals before communicating I and Q signal out of the chip 301.

In operation, a signal received by the antenna 201 may be filtered by the VHF filter 310 and the UHF filter 320. A resulting VHF signal may be communicated to the LNA 307A and a UHF signal may be communicated to the LNA 307B. The LNAs 307A and 307B may receive the VHF and UHF signal and may generate master and slave output signals as a result of amplifying the received signals. The VHF master signal 325 may be communicated to the mixers 311A and 311B, and the UHF master signal 327 may be communicated to the mixers 311C and 311D. The VHF slave signal 321 and the UHF slave signal 323 may be communicated to the combiner 309, which may sum the slave signals generating an output signal that may be communicated off the chip 301. In instances where the switch 319 is closed, an external signal may also be added by the combiner 309.

The mixers 311A and 311B may down-convert the VHF master signal 325 and the UHF master signal 327 to IF and/or baseband frequencies. The frequency of the LO signal generated by the PLL 315 may be divided by the frequency dividers 313A and 313B to provide an LO signal for the mixers 311A-311D, thereby generating sum and difference frequencies. The higher frequency signals may be filtered and the lower frequencies may be amplified by the filters/VGA module 317. The output of the filters/VGA module 317 may comprise I and Q output signals that may be communicated off-chip, or to other processing circuitry in the chip 301.

Figure 4A:
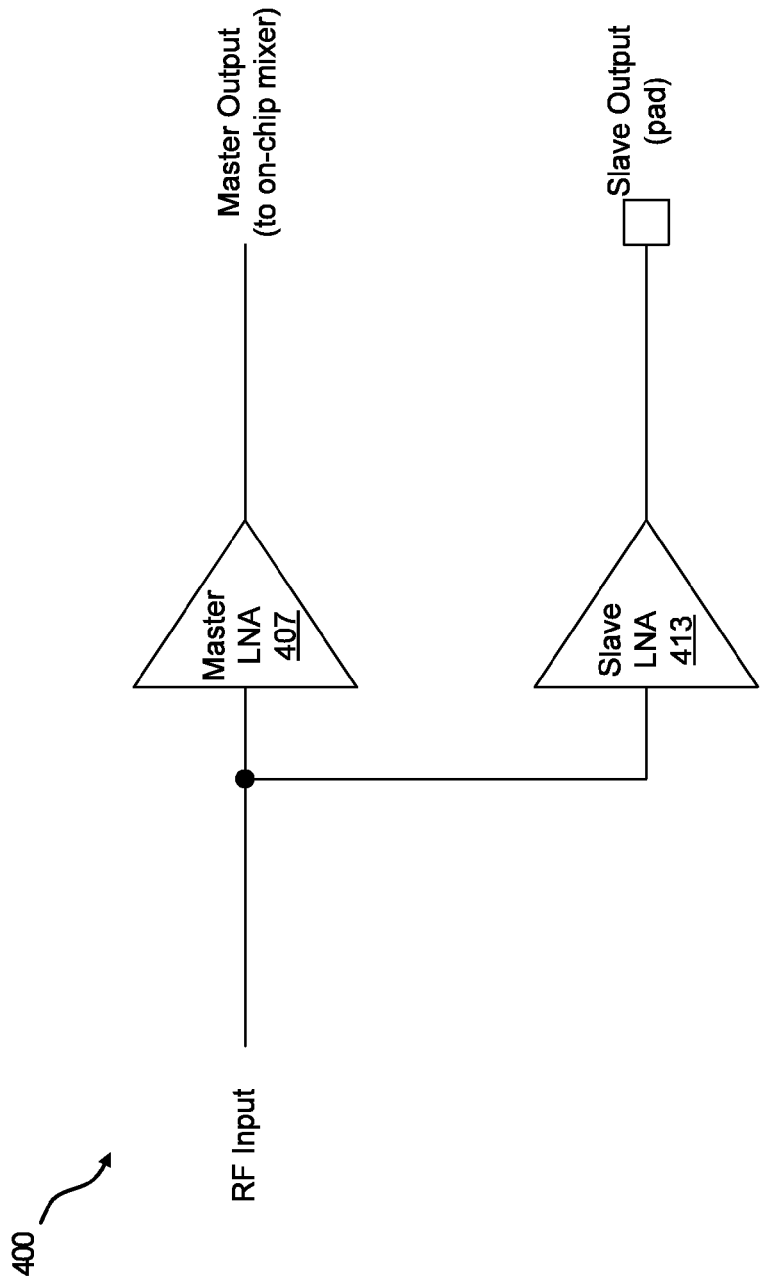
FIG. 4A is a block diagram illustrating an exemplary master/slave low-noise amplifier, in accordance with an embodiment of the invention.

FIG. 4A is a block diagram illustrating an exemplary master/slave low-noise amplifier, in accordance with an embodiment of the invention. Referring to FIG. 4A, there is shown a master LNA 407 and a slave LNA 413. There is also shown an RF input, a master output, and a slave output.

The master LNA 407 and the slave LNA 413 may comprise suitable circuitry, logic, interfaces, and/or code that may be operable to amplify the received RF input and generate the master output and the slave output, respectively.

In operation, the master LNA 407 and slave LNA 413 may comprise coupled LNA stages that may amplify the same input while generating separate outputs without loading effects. A single impedance matching inductor combination may be utilized, due to the coupled arrangement of the LNAs, as described with respect to FIG. 4B.

Figure 4B:
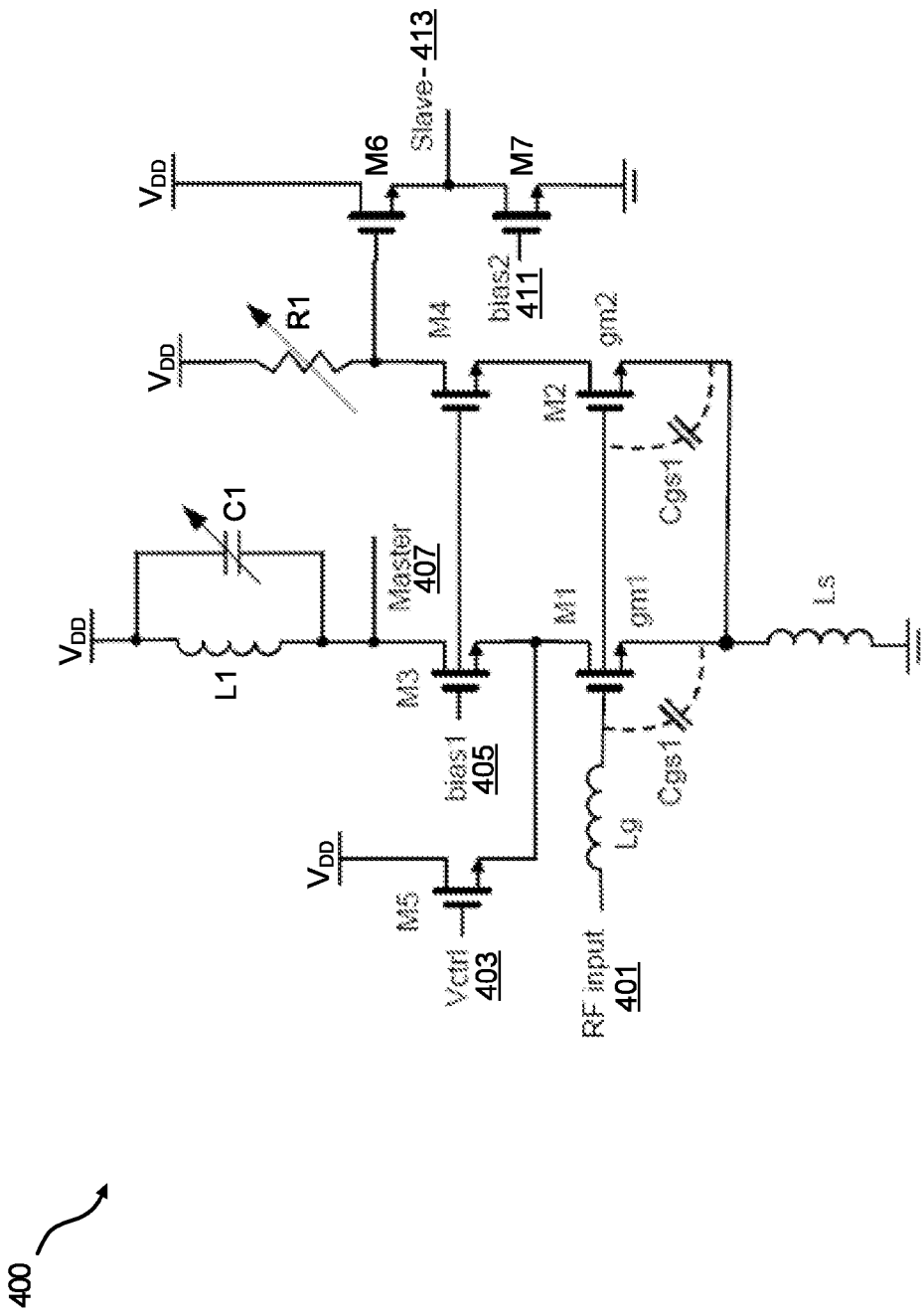
FIG. 4B is a block diagram of an exemplary master/slave low-noise amplifier circuit, in accordance with an embodiment of the invention.

FIG. 4B is a block diagram of an exemplary master/slave low-noise amplifier circuit, in accordance with an embodiment of the invention. Referring to FIG. 4B, there is shown the master/slave LNA 400 comprising CMOS transistors M1-M7, a variable capacitor C1, a variable resistor R1, and inductors L1, Lg, Ls. There is also shown parasitic capacitances CGS1 for transistors M1 and M2, an RF input 401, control voltage Vctrl 403, bias voltages bias1 405 and bias2 411, supply voltage $V_{DD}$, a master output 407, and a slave output 413.

The CMOS transistors M3 and M4, inductor L1 and capacitor C1 may comprise a master component of the LNA 400, and the CMOS transistors M2, M4, M6, and M7 and resistor R1 may comprise a slave output 413 of the LNA 400, both components comprising a cascode configuration. The transistors M6 and M7 may comprise a buffer for the output of slave stage of the LNA 400.

The gate terminals of transistors M3 and M4 may be coupled to the vbias 1 405 input, thereby providing consistent bias conditions for the master and slave outputs 407 and 413. Similarly, the gate terminals of the transistors M1 and M2 may both be coupled to the RF input 401 via the inductor Lg, and the source terminals may be commonly coupled to ground via the inductor Ls. In this manner, impedance matching may be obtained for the master and slave stages of the LNA 400.

In operation, an RF signal may be communicated to the LNA 400 via the RF input 401 and the inductor Lg. The bias voltage bias1 405 may be utilized to configure the bias conditions for the master and slave stages of the LNA 400. The resonance frequency of the LNA 400 may be configured by the variable capacitance C1, and the bias condition for the buffer stage of the slave stage of the LNA 400 may be configured by the bias voltage bias2 411.

In addition, the bias conditions of the slave and master stages may be configured by the bias voltage Vctrl and the variable resistor R1. The master and slave stages of the LNA 400 may generate amplified signals at the master output 407 and the slave output 413, respectively.

In an embodiment of the invention, the transistor M2 may be impedance matched with M1 for minimizing noise, with both M1 and M2 configuring the input impedance matching as shown in the following equation:

$$\frac{(g_{m1} + g_{m2}) * L_s}{C_{gs1} + C_{gs2}}$$

where gm1 and gm2 comprise the transconductances for transistors M1 and M2, and Cgs1 and Cgs2 are the gate-source capacitances of M1 and M2.

Figure 5A:
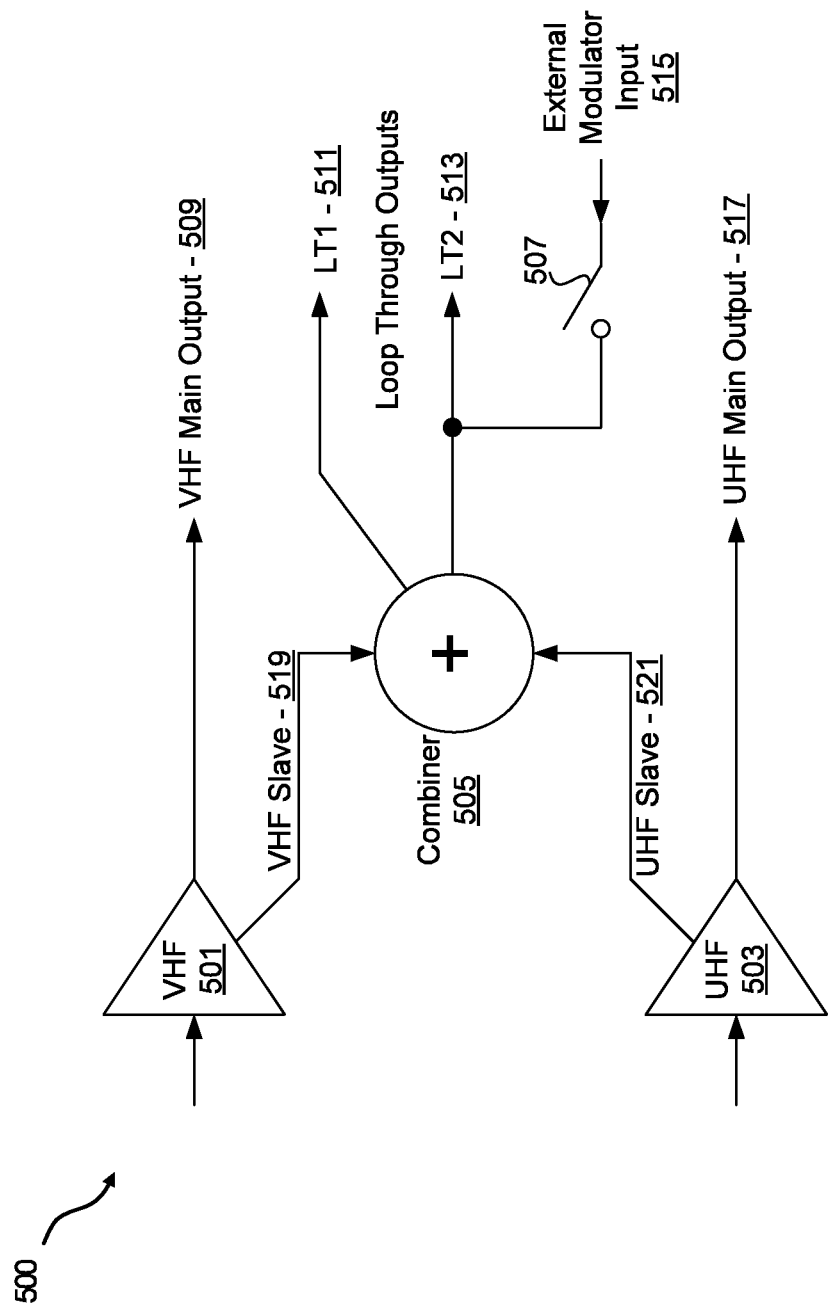
FIG. 5A is a block diagram illustrating a multi-band master/slave low-noise amplifier front-end, in accordance with an embodiment of the invention.

FIG. 5A is a block diagram illustrating a multi-channel master/slave low-noise amplifier front-end, in accordance with an embodiment of the invention. Referring to FIG. 5A, there is shown a multi-channel LNA front-end 500 comprising a VHF LNA 501, a UHF LNA 503, a combiner 505, and a switch 507. There is also shown a VHF main output 509, loop-through outputs 511 and 513, an external modulator input 515, a UHF main output 517, a VHF slave signal 519, and a UHF slave signal 521.

The VHF LNA 501, the UHF LNA 503, the combiner 505, and the switch 507 may be substantially similar to the LNAs 307A and 307B, the combiner 309, and the switch 319 described with respect to FIG. 3.

In operation, filtered RF signals may be communicated to the VHF LNA 501 and the UHF LNA 503, which may generate amplified master and slave output signals comprising the VHF main output 509, the VHF slave signal 519, the UHF main output 517, and the UHF slave signal 521. The VHF slave signal 519 and the UHF slave signal 521 may be communicated to the combiner 505, generating an output signal that is the sum of the input signals and may comprise the loop-through signals LT1 511 and LT2 513, In an embodiment of the invention, in instances where the switch 507 is closed, the signal received at the external modulator input 515 may also be communicated to the combiner 505 for summing with the VHF slave signal 519 and the UHF slave signal 521.

Figure 5B:
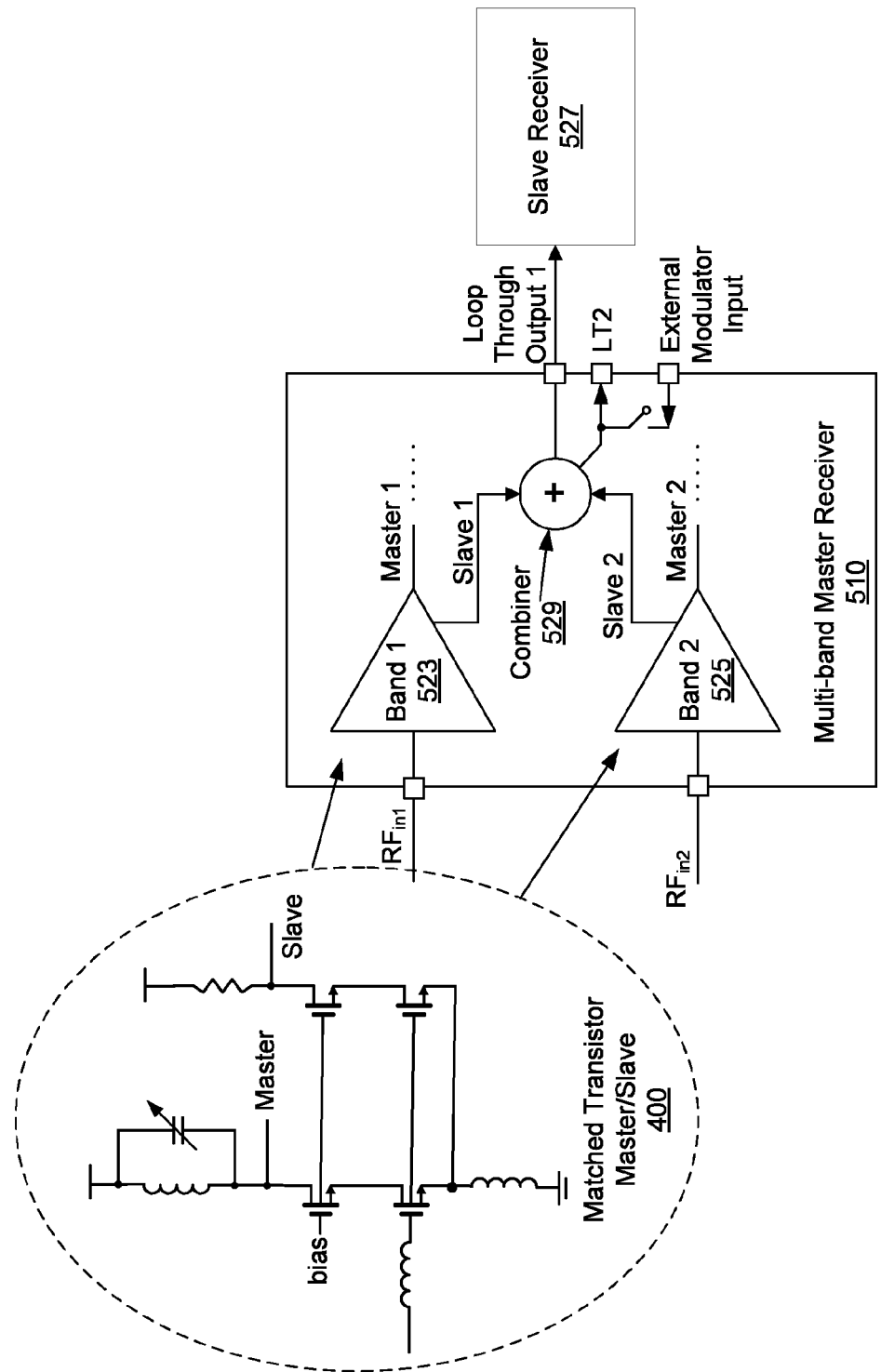
FIG. 5B is a block diagram illustrating an exemplary loop-through, in accordance with an embodiment of the invention.

FIG. 5B is a block diagram illustrating an exemplary loop-through, in accordance with an embodiment of the invention. Referring to FIG. 5B, there is shown a multi-band master receiver 510 and a slave receiver 527. There is also shown a, RFin1 signal, an RFin2 input, a master 1 output, a slave 1 output, a master 2 output, a slave 2 output, and a loop-through output. The multi-band master/slave 510 may comprise a band 1 LNA 523, a band 2 LNA 525, and a combiner 529, which may be substantially similar to the VHF LNA 501, the UHF LNA 503, and the combiner 505, described with respect to FIG. 5A.

In operation, a received RF signal may be filtered into separate bands, band 1 and band 2, to be communicated to the band 1 LNA 523 and the band 2 LNA 525 as the RFin1 and RFin2 signals. The band 1 LNA 523 and the band 2 LNA 525 may amplify the received signals, generating main and slave outputs. The slave 1 and slave 2 outputs may be summed by the combiner 529 to generate a single loop-through output to be communicated to the slave receiver 527. The master 1 and master 2 outputs may be communicated to on-chip mixers for further processing, as described with respect to FIG. 2. The slave receiver may tune to a desired frequency channel in the loop-through output signal and generate an output signal suitable for display, as described with respect to FIG. 1.

Figure 6:
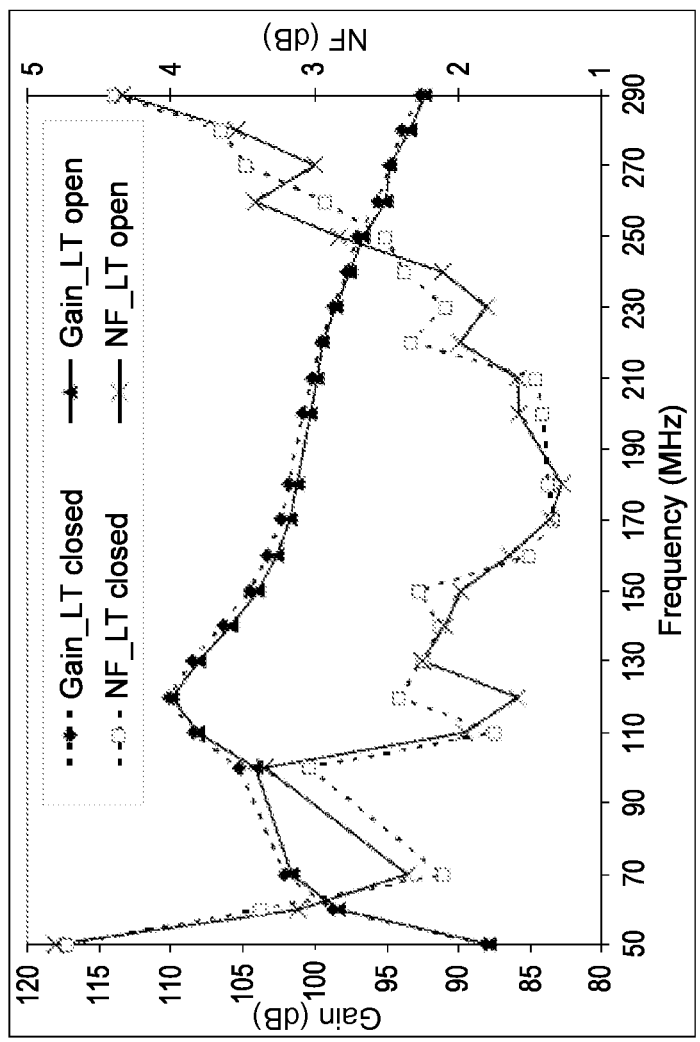
FIG. 6 is a block diagram illustrating exemplary VHF gain and noise figure versus frequency response of a master/slave low-noise amplifier, in accordance with an embodiment of the invention.

FIG. 6 is a block diagram illustrating exemplary VHF gain and noise figure versus frequency response of a master/slave low-noise amplifier, in accordance with an embodiment of the invention. Referring to FIG. 6, there is shown gain and noise figure curves with dash-lines representing performance with the loop-through stage of an LNA, such as the master/slave LNA 400, in operation, and the solid lines represent performance with the slave stage open, or not in operation. The curves indicate that the slave stage has minimal impact on the performance of the master/slave LNA.

Figure 7:
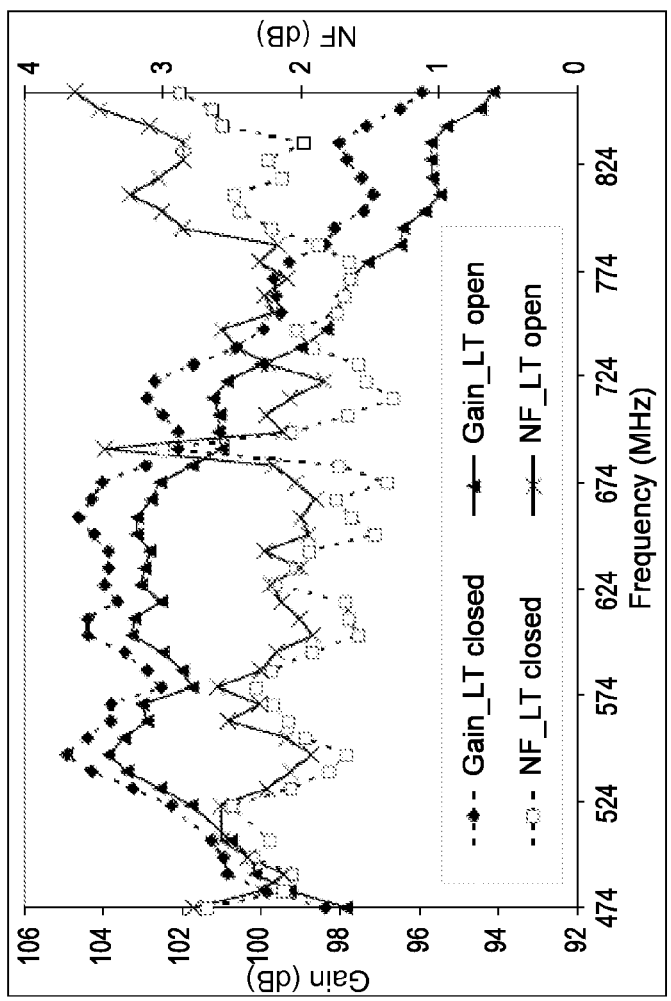
FIG. 7 is a block diagram illustrating exemplary UHF gain and noise figure versus frequency response of a master/slave low-noise amplifier, in accordance with an embodiment of the invention.

FIG. 7 is a block diagram illustrating exemplary UHF gain and noise figure versus frequency response of a master/slave low-noise amplifier, in accordance with an embodiment of the invention. Referring to FIG. 6, there is shown gain and noise figure curves with dashed-lines representing performance with the loop-through stage of an LNA, such as the master/slave LNA 400, in operation, and the solid lines represent performance with the slave stage open, or not in operation. The curves indicate that the slave stage has minimal impact on the performance of the master/slave LNA.

Figure 8:
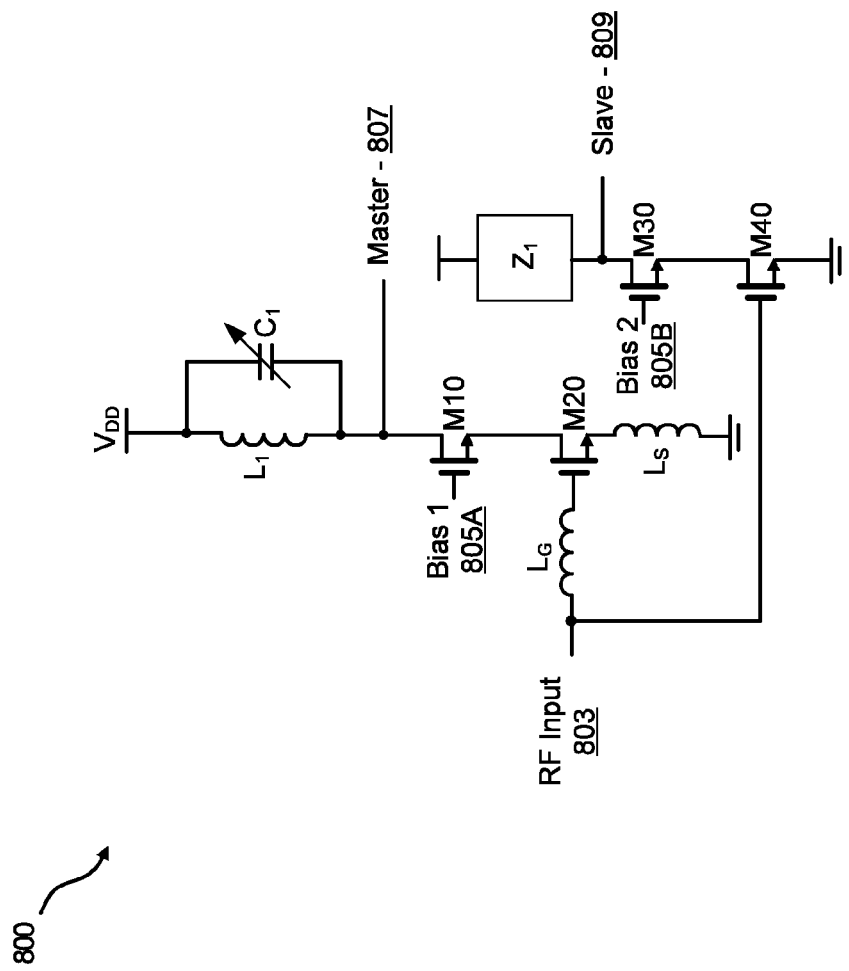
FIG. 8 is a block diagram illustrating a conventional master and slave low-noise amplifier, in connection with an embodiment of the invention.

FIG. 8 is a block diagram illustrating a conventional master and slave low-noise amplifier, in connection with an embodiment of the invention. Referring to FIG. 8, there is shown a conventional master/slave LNA 800 comprising transistors M20, M30, and M40, inductors Lg and Ls, and an impedance Z1. There is also shown an RF input 803, bias voltages bias 1 805A and bias 2 805B, a master output 807, and a slave output 809.

In operation, an RF signal may be communicated to the master/slave LNA 800 at the RF input 803. The bias voltage bias 1 405 may be utilized to configure the bias condition for the master stage of the master/slave LNA 800, and the bias voltage bias 2 805B may be utilized to configure the slave stage of the master/slave LNA 800. The master output 807 and the slave output 809 may be generated by the master and slave stages of the master/slave LNA 800. In this conventional configuration, the slave path may exhibit a higher noise figure due to the lack of impedance matching for the two stages, and there may be extra parasitics at the input node, requiring external matching.

Figure 9:
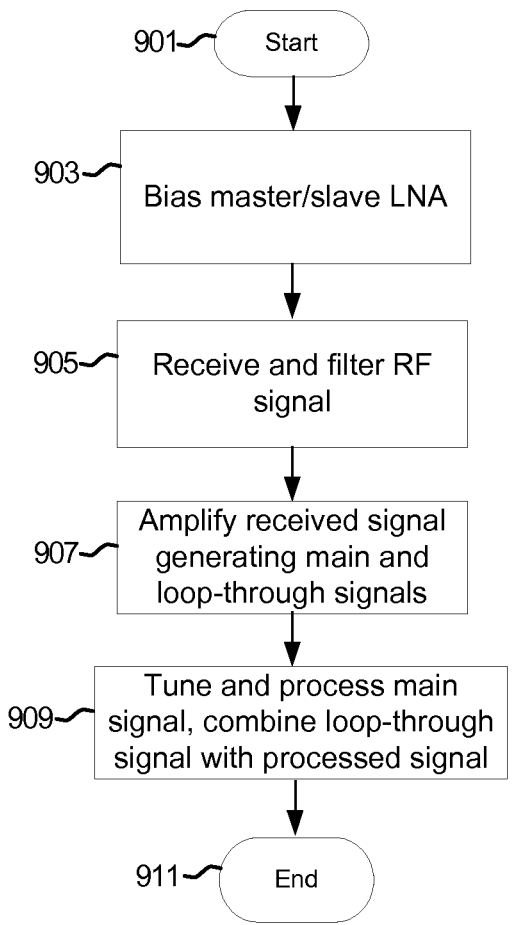
FIG. 9 is a flow diagram of an exemplary multi-band master/slave low-noise amplifier process, in accordance with an embodiment of the invention.

FIG. 9 is a flow diagram of an exemplary multi-band master/slave low-noise amplifier process, in accordance with an embodiment of the invention. The exemplary steps may begin with step 903, where the master and slave stages of the LNA may be biased. In step 905, an RF signal may be received and filtered into desired frequency bands. In step 907, the filtered signals may be received by the appropriate band gain stage for amplification, thereby generating main and slave, or loop-through signals. In step 909, the main signal may be further processed for subsequent display, and the loop-through signals from the bands may be summed with the processed signal. This summed signal may then be communicated to an external receiver, for example, followed by end step 911.

In an embodiment of the invention, a method and system are disclosed for loop through for multi-band TV tuners and set-top box and/or TV applications. Aspects of the invention comprise generating master and slave output signals in a multi-band receiver 101/200/301 from one or more low-noise amplifiers 203/307A/307B400/501/503/523/525 comprising master and slave stages 407/413. The master and slave stages 407/413 may comprise parallel-coupled gain paths. Gate terminals and source terminals of input transistors M1/M2 for the master and slave stages 407/413 may be directly coupled. The input transistors M1/M2 for the master and slave stages may share an inductor Ls coupled to the source terminals and to ground. The master and slave stages 407/413 may comprise cascode stages. VHF and UHF signals may be amplified in the multi-band receiver 101/200/301. The generated master output signal may be processed in the multi-band receiver 101/200/301, and may be utilized to generate I and Q output signals. A plurality of the slave output signals may be summed and communicated to a receiver 105/527 external to the multi-band receiver 101/200/301.

Certain embodiments of the invention may comprise a machine-readable storage having stored thereon, a computer program having at least one code section for loop through for multi-band TV tuners and set-top box and/or TV applications, the at least one code section being executable by a machine for causing the machine to perform one or more of the steps described herein.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for signal processing in a multi-band receiver, comprising:
   generating a secondary output signal comprising a loop-through signal that is isolated from a primary output signal, wherein the primary and secondary output signals are generated from a low-noise amplifier comprising a primary stage and a secondary stage;
   generating a combined signal comprising the primary output signal and the secondary output signal; and
   communicating the combined signal to a receiver.

2. The method of claim 1, wherein the primary and secondary stages comprise cascade stages.

3. The method of claim 1, further comprising amplifying VHF signals in said multi-band receiver.

4. The method of claim 1, further comprising amplifying UHF signals in said multi-band receiver.

5. The method of claim 1, further comprising processing the generated primary output signal in said multi-band receiver.

6. The method of claim 5, further comprising generating I and Q output signals from said processed primary output signal in said multi-band receiver.

7. The method of claim 1, further comprising summing a plurality of secondary output signals and communicating the sum to a receiver external to said multiband receiver.

8. The method of claim 1, further comprising generating an output using a combined UHF low-noise amplifier output and a VHF low-noise amplifier output utilizing a combiner.

9. The method of claim 1, wherein the primary and secondary stages comprise parallel-coupled gain paths.

10. The method of claim 1, further comprising generating the primary output signal.

11. A system for signal processing in a multi-band receiver, comprising:
    a low-noise amplifier comprising a primary stage and a secondary stage, wherein the low-noise amplifier is configured to generate a secondary output signal that is isolated from a primary output signal and comprises a loop-through signal; and
    a combiner configured to output a combined signal to a receiver, wherein said combined signal comprises said primary output signal and said secondary output signal.

12. The system of claim 11, wherein a gate terminal of an input transistor for the primary stage is directly coupled to a gate terminal of an input transistor for the secondary stage.

13. The system of claim 11, wherein a source terminal of an input transistor for the primary stage is directly coupled to a source terminal of an input transistor for the secondary stage.

14. The system of claim 11, wherein a source terminal of an input transistor for the primary stage and a source terminal for an input transistor for the secondary stage share an inductor and wherein the inductor is coupled to ground.

15. The system of claim 11, wherein the primary and secondary stages comprise cascade stages.

16. The system of claim 11, wherein said low-noise amplifier is configured to amplify VHF signals in said multi-band receiver.

17. The system of claim 11, wherein said low-noise amplifier is configured to amplify UHF signals in said multi-band receiver.

18. The system of claim 11, further comprising a processor configured to process said primary output signal in said multi-band receiver.

19. The system of claim 18, further comprising one or more circuits configured to generate I and Q output signals from said processed primary output signal in said multi-band receiver.

20. The system of claim 11, further comprising one or more circuits configured to generate one or more outputs using one or more combined UHF low-noise amplifier outputs and one or more VHF low-noise amplifier outputs utilizing said combiner.

* * * * *